United States Patent
Yoon et al.

(10) Patent No.: US 6,617,894 B2
(45) Date of Patent: Sep. 9, 2003

(54) CIRCUITS AND METHODS FOR GENERATING INTERNAL CLOCK SIGNAL OF INTERMEDIATE PHASE RELATIVE TO EXTERNAL CLOCK

(75) Inventors: Yong-Jin Yoon, Seoul (KR); Uk-Rae Cho, Kyonggi-do (KR); Jung-Woo Park, Seoul (KR); Kwang-Jin Lee, Seoul (KR); Nam-Seog Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/081,359

(22) Filed: Feb. 20, 2002

(65) Prior Publication Data

US 2002/0167346 A1 Nov. 14, 2002

Related U.S. Application Data

(60) Provisional application No. 60/291,076, filed on May 14, 2001.

(51) Int. Cl.[7] ................................................ H03L 7/00
(52) U.S. Cl. ...................................... 327/161; 327/153
(58) Field of Search ................................. 327/141, 152, 327/153, 161, 294; 365/233

(56) References Cited

U.S. PATENT DOCUMENTS

| | | | |
|---|---|---|---|
| 5,544,203 A | 8/1996 | Casasanta et al. ........... 375/376 |
| 5,552,726 A | 9/1996 | Wichman et al. ............ 327/149 |
| 5,675,274 A | 10/1997 | Kobayashi et al. .......... 327/158 |
| 5,708,611 A | 1/1998 | Iwamoto et al. ............. 365/195 |
| 5,796,673 A | 8/1998 | Foss et al. ................... 365/233 |
| 5,883,853 A | 3/1999 | Zheng et al. ................ 365/233 |
| 5,901,190 A | * 5/1999 | Lee .............................. 375/373 |
| 5,955,905 A | 9/1999 | Idei et al. .................... 327/160 |
| 5,999,032 A | 12/1999 | Wang et al. ................. 327/292 |
| 6,060,928 A | 5/2000 | Jun et al. ..................... 327/261 |
| 6,084,453 A | * 7/2000 | Fuse et al. ................... 327/176 |
| 6,111,925 A | 8/2000 | Chi .............................. 375/354 |
| 6,175,605 B1 | 1/2001 | Chi .............................. 375/371 |
| 6,310,822 B1 | * 10/2001 | Shen ........................... 365/233 |
| 6,373,913 B1 | * 4/2002 | Lee .............................. 375/376 |
| 6,388,484 B1 | * 5/2002 | Kamoshida et al. ......... 327/161 |

* cited by examiner

Primary Examiner—Tuan T. Lam
(74) Attorney, Agent, or Firm—Marger Johnson & McCollom, P.C.

(57) ABSTRACT

A circuit includes a clock buffer to generate an initial reference clock signal responsive to an external clock signal, a DMC to receive the initial reference clock signal, and an array of forward units to receive a signal from the DMC. The circuit also includes an array of back units that produces a back signal. The back signal is input in a clock driver to produce an internal clock signal. A delay element produces a delayed reference signal responsive to the initial reference clock signal. A plurality of MCCs receive an output of one of the forward units and the delayed reference clock signal. When one of the outputs of the forward units is synchronized with the delayed reference clock signal, one of the back units is thereby activated, which initiates generation of the back signal.

22 Claims, 13 Drawing Sheets

FIG. 12

| m | Additional delays | m | Additional delays |
|---|---|---|---|
| 2 | 2*tclk | 10 | 2/9*tclk |
| 3 | 1*tclk | 11 | 1/5*tclk |
| 4 | 2/3*tclk | 12 | 2/11*tclk |
| 5 | 1/2*tclk | 13 | 1/6*tclk |
| 6 | 2/5*tclk | 14 | 2/13*tclk |
| 7 | 1/3*tclk | 15 | 1/7*tclk |
| 8 | 2/7*tclk | 16 | 2/15*tclk |
| 9 | 1/4*tclk | 17 | 1/8*tclk |

# CIRCUITS AND METHODS FOR GENERATING INTERNAL CLOCK SIGNAL OF INTERMEDIATE PHASE RELATIVE TO EXTERNAL CLOCK

CROSS REFERENCE TO RELATED APPLICATIONS

This application claims priority from U.S. Provisional Application No. 60/291,076, filed on May 14, 2001, which is hereby incorporated by reference.

BACKGROUND OF THE INVENTION

1. Field of the Invention

The present invention is related to the field of circuits and methods for generating clock signals for a semiconductor memory, and more specifically to a multiphase clock generator and a method for generating an internal clock signal having a phase of an intermediate value relative to an external clock.

2. Description of the Related Art

Integrated circuits coordinate their operations through clock signals (also known as clocks).

Referring to FIG. 1, a circuit structure is shown for treating clock signals. The structure is described in more detail in U.S. Pat. No. 5,999,032.

Briefly, an external system clock XCLK is provided to generate an internal clock ICLK. The system clock XCLK is received by the input buffer IBUF. The input buffer IBUF has a delay time from the input of the system clock XCLK to the output of the input buffer IBUF that is designated d1.

The output of the input buffer IBUF is input to multiple internal buffers INTBUF (only one is shown), which output internal clock ICLK. The delay time for the internal buffer INTBUF is designated d2.

The internal clock ICLK is then transferred to the functional units within the integrated circuit chip. The internal clock ICLK will be the timing signal that is used to synchronize the transfer of the digital data from the internal circuits of an integrated circuit chip to the data input/output buffers, and to the data bus of the integrated circuit chip.

Referring now to FIG. 2, a timing diagram is shown for the circuit of FIG. 1. The external clock XCLK will be delayed or skewed by the delay d1 of the input buffer IBUF, plus the delay d2 internal buffer INTBUF. Since the timing of the functions of integrated circuits such as a SDRAM are determined by the internal clock ICLK, the access time T(acc) of the fetching or reading of the digital data from an SDRAM can be no smaller than the clock skew d1+d2.

As computer system clocks are approaching transfer rates of 100 MHz, it is desirable that the access time T(acc) of an SDRAM to be brought to +/−0.1 ns of the period of the system clock XCLK. This means that any clock skew must be eliminated from the clock distribution system.

Phase Locked Loops (PLL) and Delay Locked Loops (DLL) are well known in the art for synchronizing two timing signals. In both cases the time to achieve synchronization or lock may be on the order of 50 cycles or more. With such long lock times in SDRAM applications, the internal clocking signals ICLK cannot be deactivated during the periods that the SDRAM is inactive. This will increase the power dissipation of the SDRAM to undesirable levels.

The Clock Synchronization Delay (CSD) is a class of synchronizing circuits that eliminate the clock skew d1+d2 within two clock cycles. Two types of CSDs known in the art are the latch type CSD and the nonlatched synchronous mirror delay (SMD).

Referring now to FIG. 3, a schematic diagram is shown for the general structure of a SMD circuit. As in FIG. 1, the system clock XCLK is received by the input buffer IBUF, and outputs a signal IBO, delayed by the delay d1. The output IBO of the input buffer IBUF is input to a delay monitor circuit DMC. The delay monitor circuit DMC will provide an output that is a delayed input signal IBO by a fixed amount. That fixed amount is usually designed to equal the sum of the delay d1 of the input buffer IBUF and the delay d2 of the internal buffer INTBUF.

The circuit of FIG. 3 includes three arrays, a forward delay array (FDA), an array of elements of a mirror control circuit (MCC), and a back delay array (BDA). These have corresponding elements.

The output of the delay monitor circuit DMC is input in forward delay array FDA. The forward delay array FDA is made from a number of delay elements. Each of those delay elements delays the input of the forward delay array FDA by an increment of time t(DF). The output of each delay element of the forward delay array FDA is input in each subsequent delay element, and is also one of the multiple outputs of the forward delay array FDA.

The multiple outputs of the forward delay array FDA are input in corresponding elements of a mirror control circuit MCC. The output IBO of the input buffer circuit IBUF is also provided to multiple inputs of the elements of mirror control circuit MCC. In each such element, the output IBO of the input buffer circuit IBUF is compared with each output of the forward delay array FDA. When one of the outputs of the forward delay array FDA is aligned with the n+1 pulse of the output IBO of the input buffer IBUF, the element of the mirror control circuit will transfer that one output to a corresponding element of the backward delay array BDA. The mirror control circuit MCC will have multiple outputs to transfer any one of the inputs of the mirror control circuit MCC from the forward delay array FDA to the backward delay array BDA.

The backward delay array BDA is comprised of multiple delay elements. Each delays element has a delay time t(DF) equal to the delay time of the forward delay array FDA.

Referring now to FIG. 4, a timing diagram is shown for the circuit of FIG. 3. The delayed clock pulse will be delayed by a factor of:

$$t(FDA)=t(CK)-(d1+d2)$$

where:
t(CK) is the time of the period of the external clock, and
t(FDA) is the time of the period of the FDA, less the skew d1+d2.

The delayed clock pulse will be further delayed by the factor t(FDA) in the backward delay array BDA. Thus the nth pulse output of the backward delay array BDA will be delayed by a factor of:

$$2d1+d2+2[t(CK)-(d1+d2)]=-d2$$

This will make the nth pulse of the backward delay array BDA misaligned with the n+2 pulse of the system clock XCLK by a factor of the delay d2 of the internal buffer INTBUF.

The output of the backward delay array BDA will be the input of the internal buffer INTBUF. The nth internal clock ICLK will now be aligned with the system clock XCLK.

The mirror control circuit MCC can be of two types.

The first type can be a latch that will fix the delay segment of the forward delay element FDA selected to be transferred to the backward delay array BDA. Once the latch is set, it will only be reset during the inactivity time of the SDRAM. Upon reactivation of the SDRAM, the decision of the length of the delay necessary will be recreated.

The second type of mirror control circuit MCC can be the synchronous mirror delay (SMD). The mirror control circuit MCC will be a pass gate that is activated when the output of the forward delay circuit FDA is aligned with the n+1 pulse of the output IBO of the input buffer circuit IBUF. The synchronous mirror delay will choose on each cycle of the system clock XCLK, which of the delay elements is satisfactory to align with the output IBO of the input buffer circuit IBUF.

Referring now to FIG. 5, a detail is illustrated of a prior art embodiment that uses the second type of mirror control circuit (MCC). Circuit 500 has a FDA made of successive elements FD1, FD2, . . . , FDm, made from synchronous mirror delays (SMDs). Circuit 500 also has a BDA made of successive elements BD1, BD2, . . . , BDm, and a MCC array made of successive elements MCC1, MCC2, . . . , MCCm. A clock driver corresponds to internal buffer INT-BUF.

The clock buffer receives the external clock signal Ext.CLK, and outputs an intermediate signal PCLK. Intermediate signal PCLK is delayed through a DMC (Delay Monitoring Circuit), and then input in the FDA. Then PCLK is compared with outputs of elements of the FDA at corresponding elements of the MCC.

In the case of FIG. 5, by-way of example, comparison is triggered at element MCC3, and the remainder of these arrays is unused. An in-phase locked FDA1 signal is output at MCC3. The FDA1 signal is delayed through a backward delay array (BDA) path selected by MCC3 to generate a BDA1 signal. The BDA1 signal passes through a clock driver to generate an internal clock INT.CLK. The backward delay array (BDA) is also associated with a dummy MCC array, having elements Dummy MCCn.

Referring now also to FIG. 6, an in-phase locked FDA1 signal is output at exactly one cycle after PCLK at MCC3. Such a SMD can make internal clock that is same phase in relation to external clock after only 2 cycles of the external clock.

When a delay of the clock buffer is designated td1, delay of the clock driver td2 and delay of the SMD delay unit T(du), a SMD is generally locked in two cycles. In other words, td1+tdmc+n*T(du)+n*T(du)+td2=2tclk, where tdmc1 is the delay time of DMC. Therefore, the delay of DMC may be advantageously set to equal td1+td2.

In general, if a locking operation is at the nth delay unit of a conventional SMD in FIG. 5, the locking operation can be indicated by the following:

$(td1+td2)+n*T(du)=tclk$ @ conventional SMD locking (Equation 1)

$Int.CLK=Ext.CLK+td1+td1+td2+2(tclk-(td1+td2))+td2=Ext.CLK+2tclk$

Even with the above structure, however, there is a problem in the conventional SMD. Even if it can generate an internal clock in-phased (0 degree) in relation to an external clock, it is impossible to lock it at phases of intermediate values, such as of 45, 90, 270, 325 degrees and the like.

One solution is taught in U.S. Pat. No. 5,999,032 which, however, is complicated. Another solution may be by using a DLL circuit. That, however, has disadvantages like requiring a complex design, and resulting in a long locking time.

Since input data may be aligned both with an edge of the external clock and a center portion of it, an open loop type of a clock delay line circuit is also needed for locking at phases having intermediate general values, such as 45, 90, 270 and 325 degrees.

BRIEF SUMMARY OF THE INVENTION

The present invention overcomes these problems and limitations of the prior art. Generally, the present invention provides circuits and methods for generating an internal clock signal that has a phase of an intermediate value relative to an external clock.

A circuit made according to a general embodiment of the invention includes a clock buffer to generate an initial reference clock signal responsive to an external clock signal, a DMC to receive the initial reference clock signal, and an array of forward units to receive a signal from the DMC. The circuit also includes an array of back units that produces a back signal. The back signal is input in a clock driver to produce an internal clock signal. A delay element produces a delayed reference signal responsive to the initial reference clock signal. A plurality of MCCs receive an output of one of the forward units and the delayed reference clock signal. When one of the outputs of the forward units is synchronized with the delayed reference clock signal, one of the back units is thereby activated, which initiates generation of the back signal.

The invention offers the advantage that the generated internal clock signal has a controllable phase shift from the external clock signal. In addition, the advantages of the basic CSD structure are preserved.

The invention will become more readily apparent from the following Detailed Description, which proceeds with reference to the drawings, in which:

BRIEF DESCRIPTION OF THE DRAWINGS

FIG. 12 is a table of values of phase shifts that may be implemented by the invention by choosing a number m.

DETAILED DESCRIPTION OF THE PREFERRED EMBODIMENT(S)

As has been mentioned, the present invention provides circuits and methods for generating an internal clock signal that has a phase of an intermediate value relative to an external clock. The invention is now described in more detail.

Figure 1:
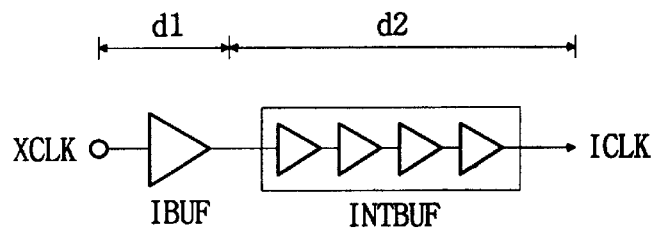
FIG. 1 is a schematic diagram of a clock distribution circuit of a SDRAM in the prior art.
Figure 2:
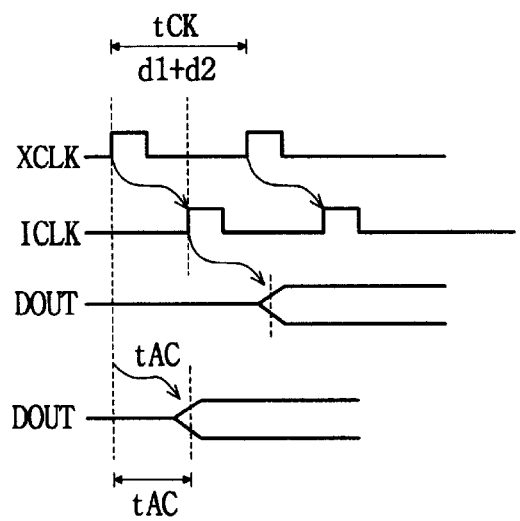
FIG. 2 is a timing diagram showing the effects of clock skew in the circuit of FIG. 1.
Figure 3:
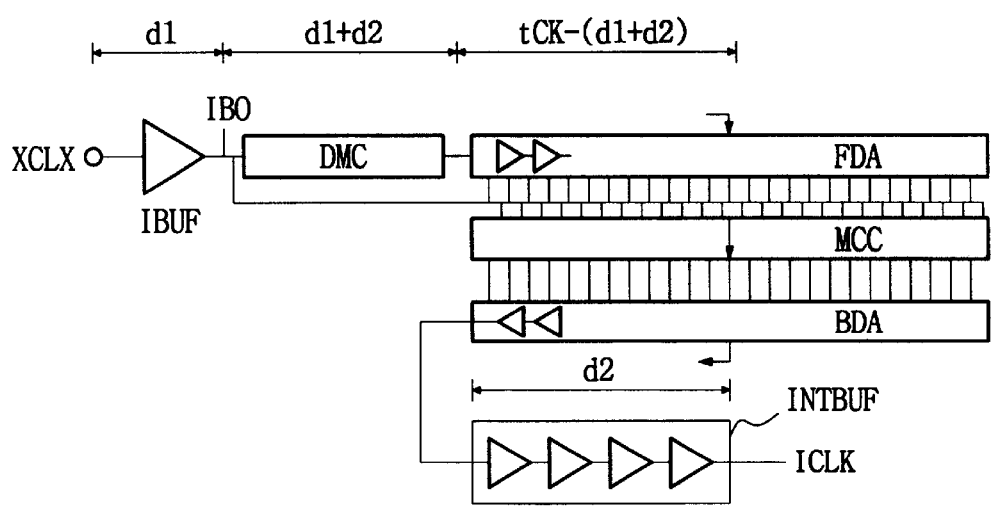
FIG. 3 is a schematic diagram of a prior art circuit using a Synchronous Mirror Delay.
Figure 4:
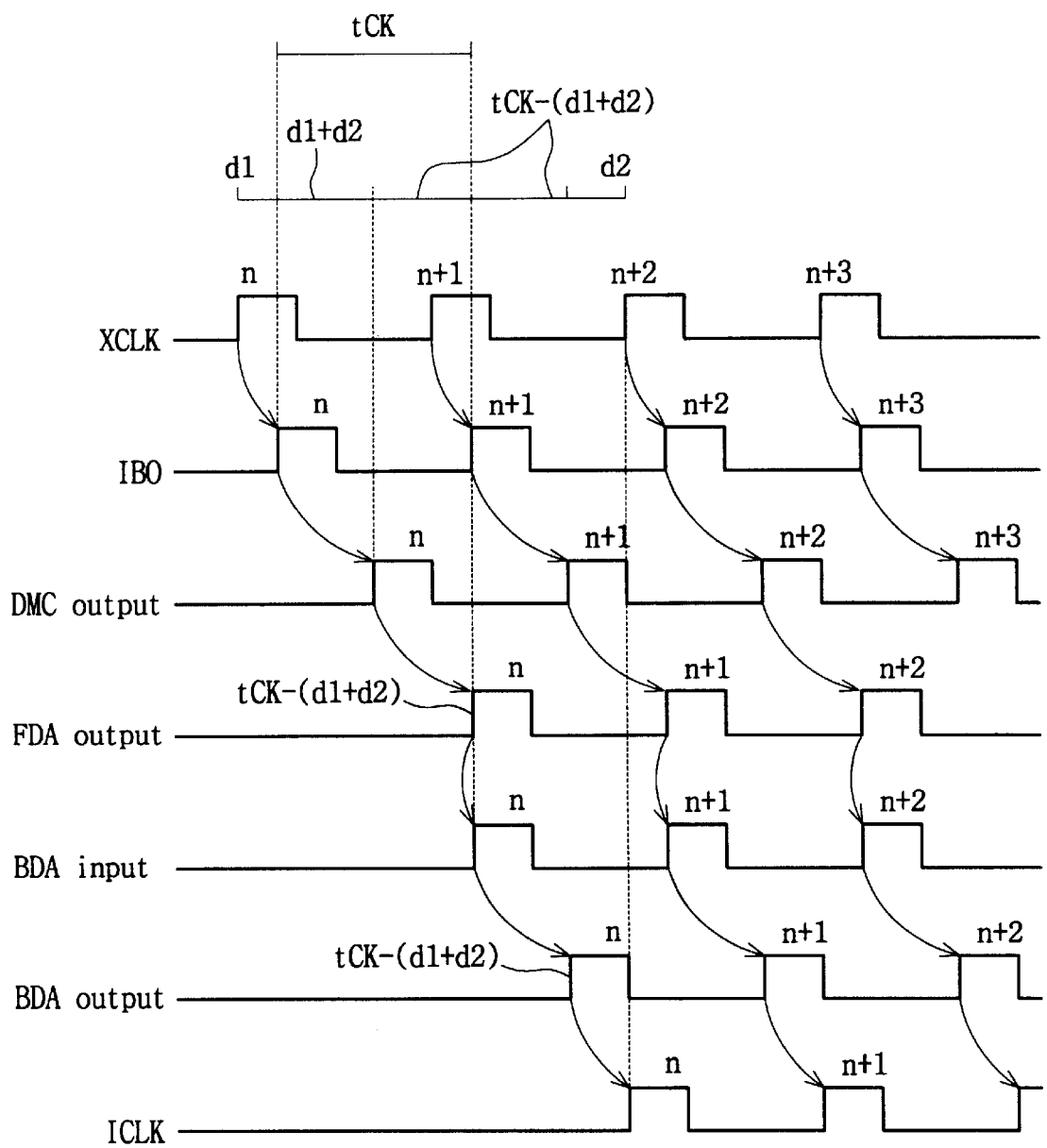
FIG. 4 is a timing diagram for the circuit of FIG. 3.
Figure 5:
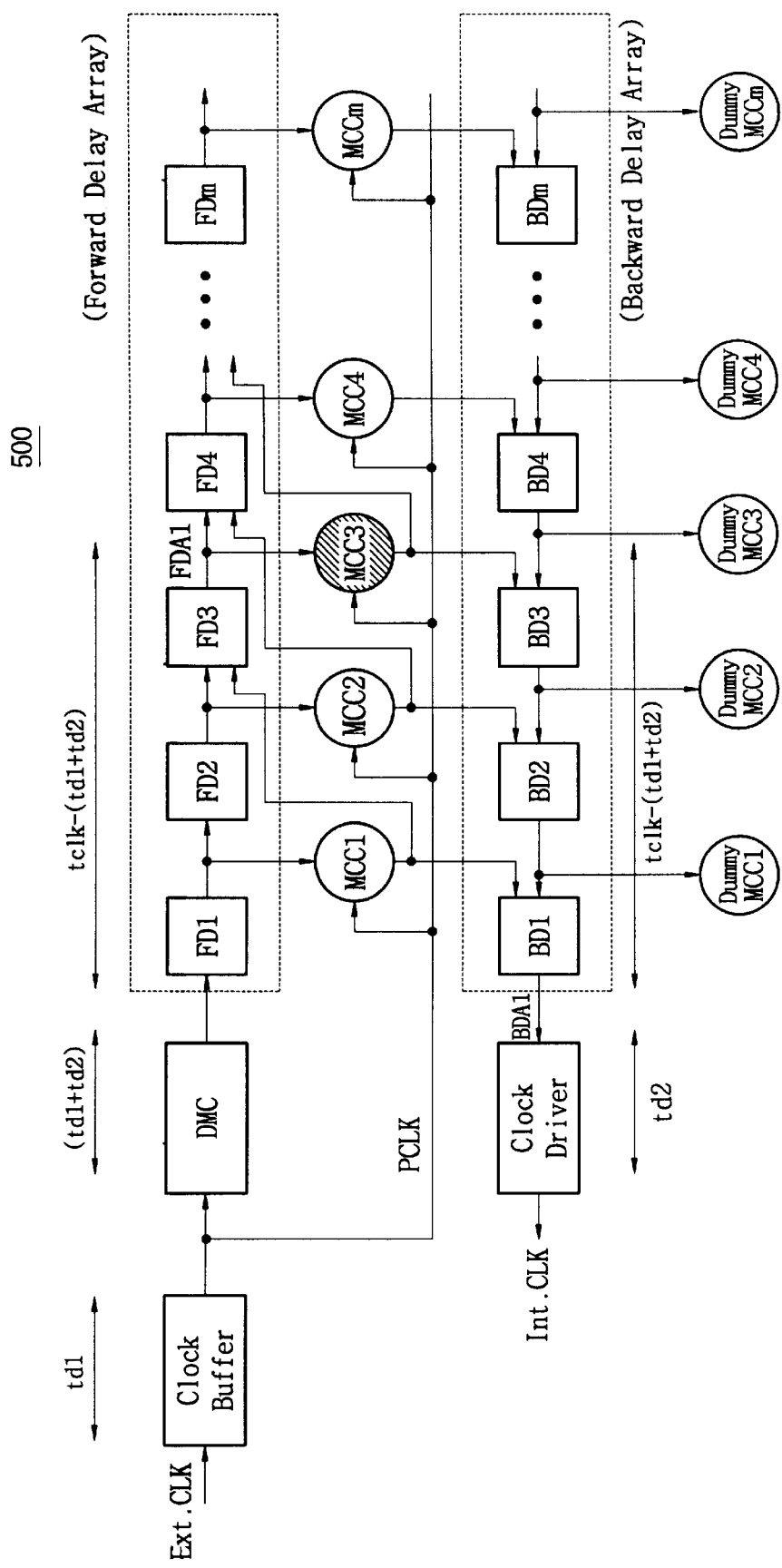
FIG. 5 is a detailed schematic diagram of a prior art circuit using a Synchronous Mirror Delay.
Figure 6:
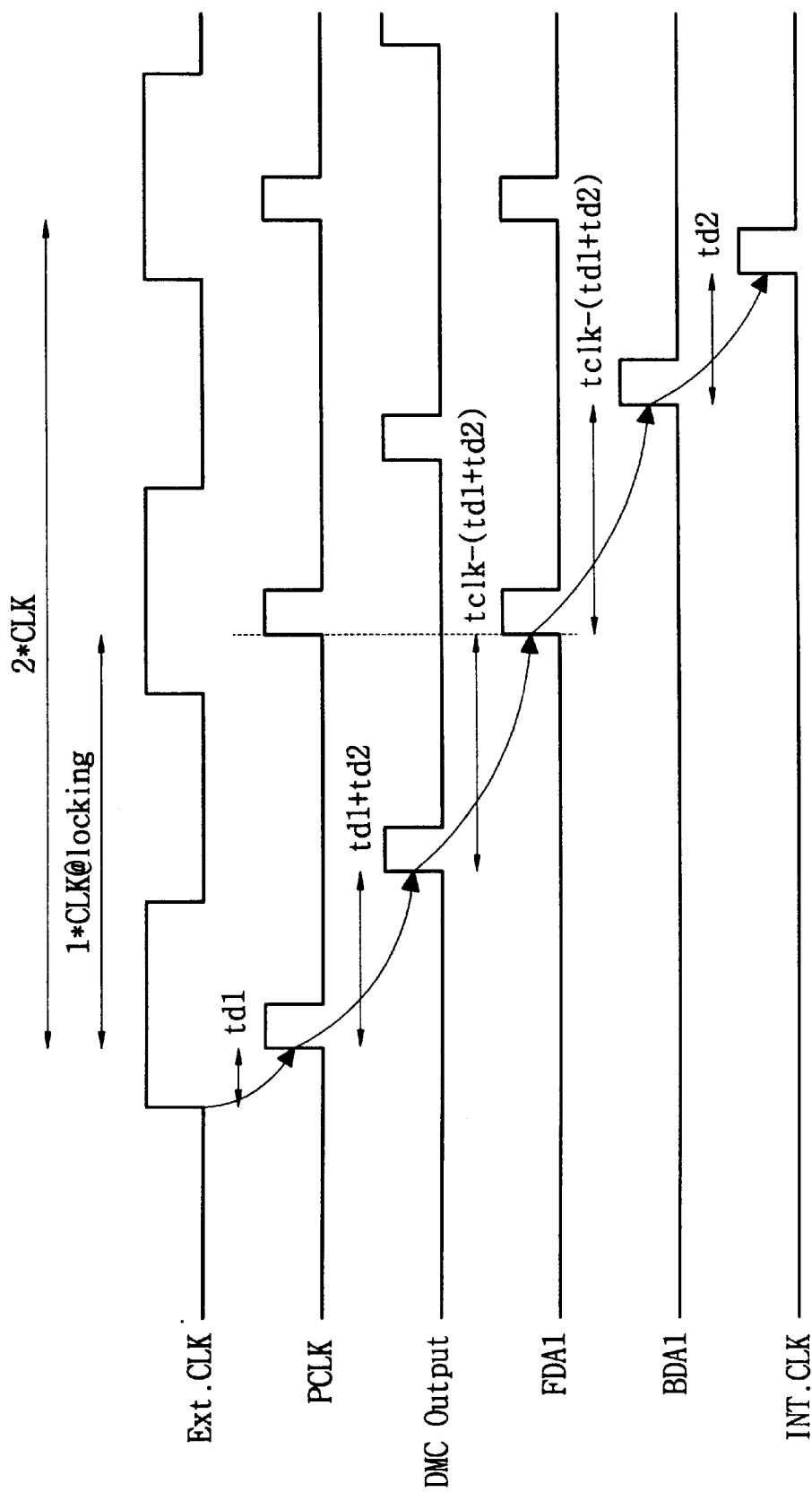
FIG. 6 is a timing diagram for the circuit of FIG. 5.
Figure 7:
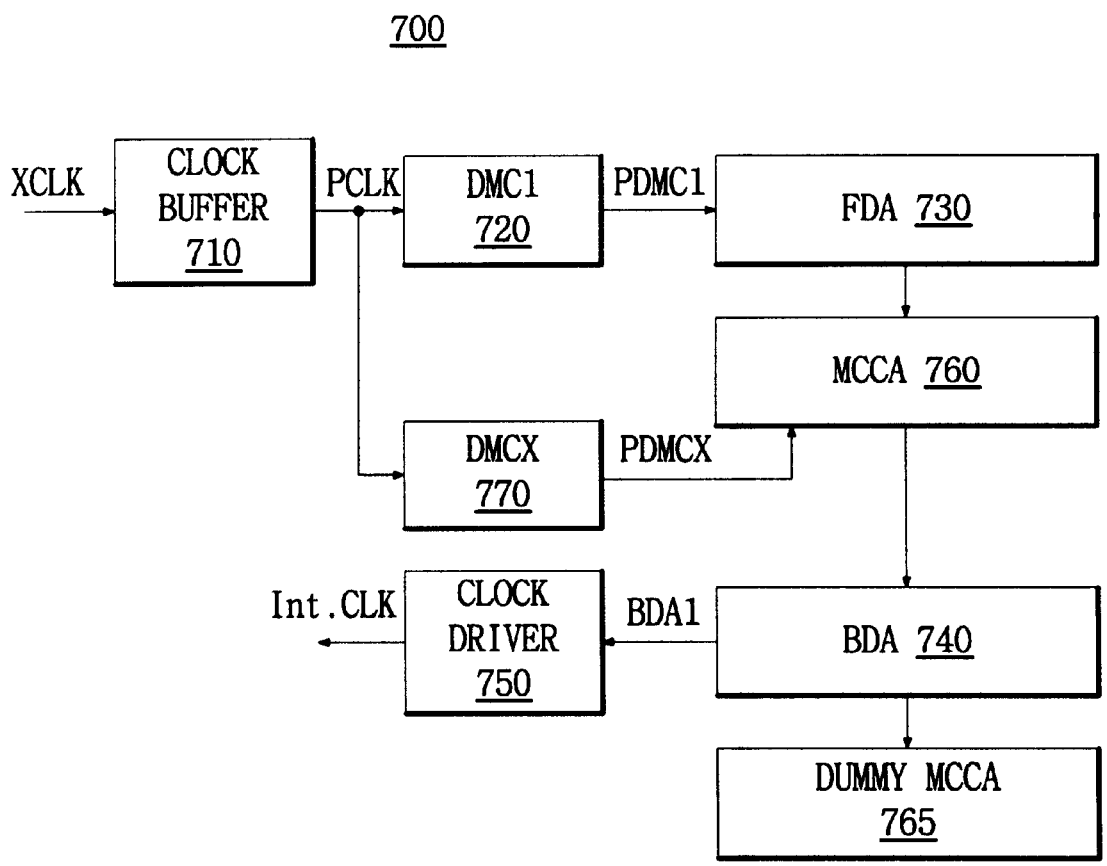
FIG. 7 is a circuit diagram of a circuit made according to a general embodiment of the present invention having a delay element between a clock buffer and an MCC array.

Referring now to FIG. 7, a circuit 700 made according to a general embodiment of the invention is described.

Circuit 700 includes a clock buffer 710, which is also known as a clock receiver. Buffer 710 receives external clock signal XCLK, which is also known as system clock. Buffer 710 generates an initial reference clock signal PCLK responsive to external clock signal XCLK. PCLK may be short pulse or same phase width.

Circuit 700 also includes a first Delay Monitor Circuit DMC1 720. DMC1 720 receives the initial reference clock signal PCLK, and outputs a first delayed reference signal PDMC1.

Circuit 700 additionally includes an array FDA 730 of forward units. The forward units of array FDA 730 are not shown individually in FIG. 7, but are shown individually in subsequent drawings. The forward units of array FDA 730 may be made in any way known in the art according to the general embodiments of the invention. Their preferred embodiments are disclosed later in this document. Array FDA 730 receives the first delayed reference signal PDMC1 from DMC1.

Circuit 700 moreover includes an array BDA 740 of back units. The back units of array BDA 740 are not shown individually in FIG. 7, but are shown individually in subsequent drawings. The back units of array BDA 740 may be made in any way known in the art according to the general embodiments of the invention. Their preferred embodiments are disclosed later in this document. A back unit at an end of array BDA 740 outputs a back signal BDA1.

Circuit 700 further includes a clock driver 750, which is also known as internal buffer. Driver 750 produces an internal clock signal Int.CLK in response to receiving the back signal BDA1.

Circuit 700 moreover includes a number of mirror control circuits (MCCs). These are preferably arranged in an array MCCA 760, although that is not necessary for practicing the present invention. Each MCC receives an output of one of the forward units. A dummy MCCA 765 is also optionally included.

Importantly, circuit 700 also includes at least one delay element in a path between clock buffer 710 and array MCCA 760. This delay element is sometimes described as standalone to distinguish from incidental phenomena of perhaps distributed nature, such as parasitic capacitance or parasitic inductance.

The standalone delay element is implemented in FIG. 7 by a Delay Monitor Circuit DMCX 770. DMCX 770 receives the initial reference clock signal PCLK, and in response generates a second delayed reference signal PDMCX.

The MCCs receive the second delayed reference signal PDMCX. When one of the outputs of the forward units is synchronized with the delayed reference clock signal, one of the back units is thereby activated. Once the back unit is activated generation of the back signal is initiated.

In the preferred embodiment, at least one of the MCCs is made as a latch, as will be understood from diagrams later in this embodiment. The latch would then detect synchronization by locking only when a transition from the output of the delayed reference clock signal occurs not later than a transition from the output of the forward unit.

Figure 8:
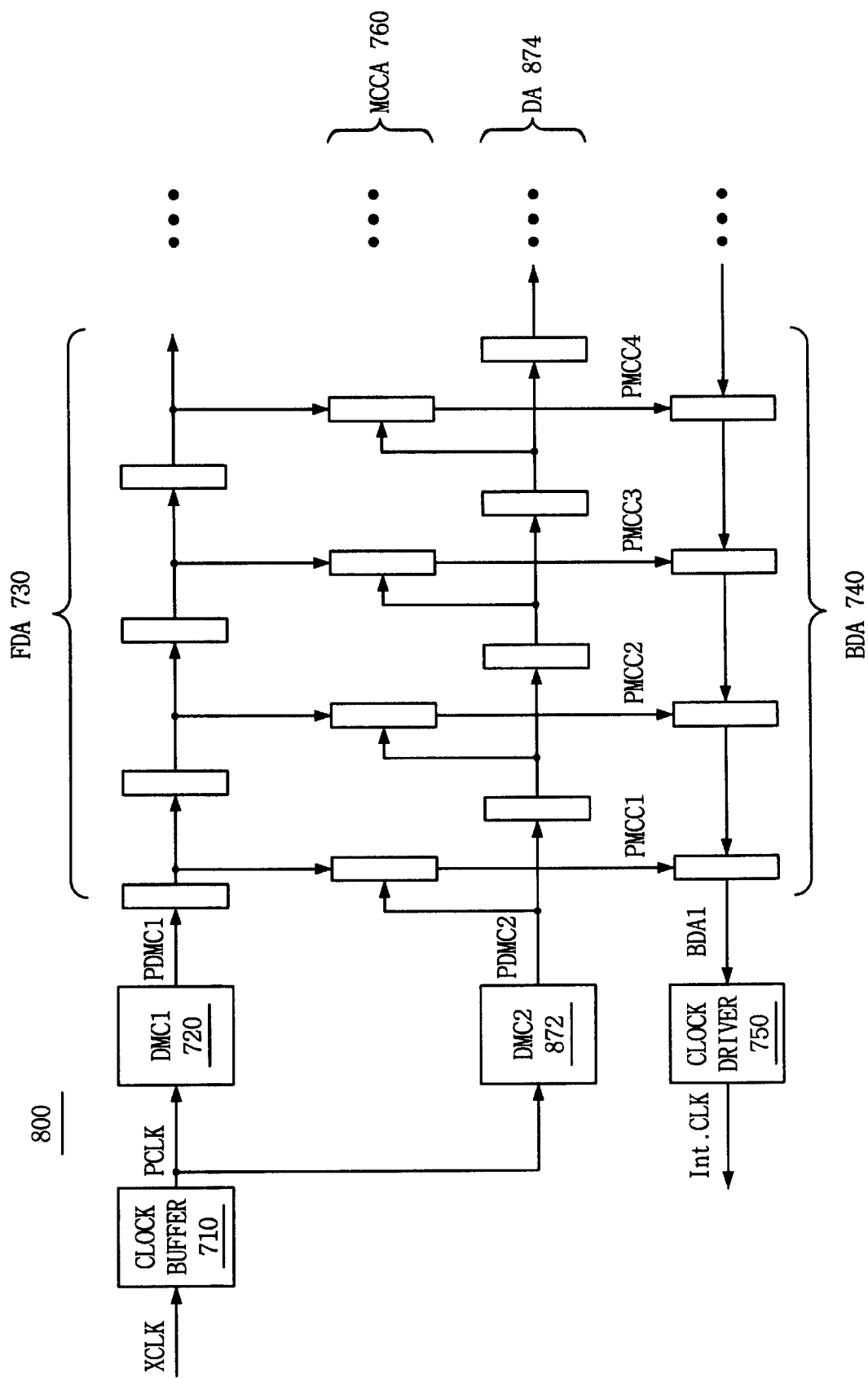
FIG. 8 is a circuit diagram of a circuit made according to a general embodiment of the present invention having multiple delay elements between a clock buffer and an MCC array.

Referring now to FIG. 8, another circuit 800 made according to another general embodiment of the invention is described. Circuit 800 includes many components similar to those of circuit 700, whose description will therefore not be repeated.

Importantly, there is a delay element made from a number of constituent elements. A constituent element is a second Delay Monitor Circuit DMC2 872, which receives the initial reference clock signal PCLK, and in response generates a second delayed reference signal PDMC2.

In addition, constituent elements of the delay are a plurality of delay units DA 874, preferably arranged in an array. The first such delay element receives signal PDMC2, and each one of the delay units DA 874 delays it further. As such, each one of the delay units DA 874 generates a differently delayed version of the delayed reference signal PDMC2.

Preferably, each MCC generates a MCC signal (PMCC1, PMCC2, . . . ) to communicate a detected state of synchronization to a corresponding one of the back units. Each MCC signal PMCCn is indicative of whether there is synchronization or not, and is input in the back unit.

Figure 9:
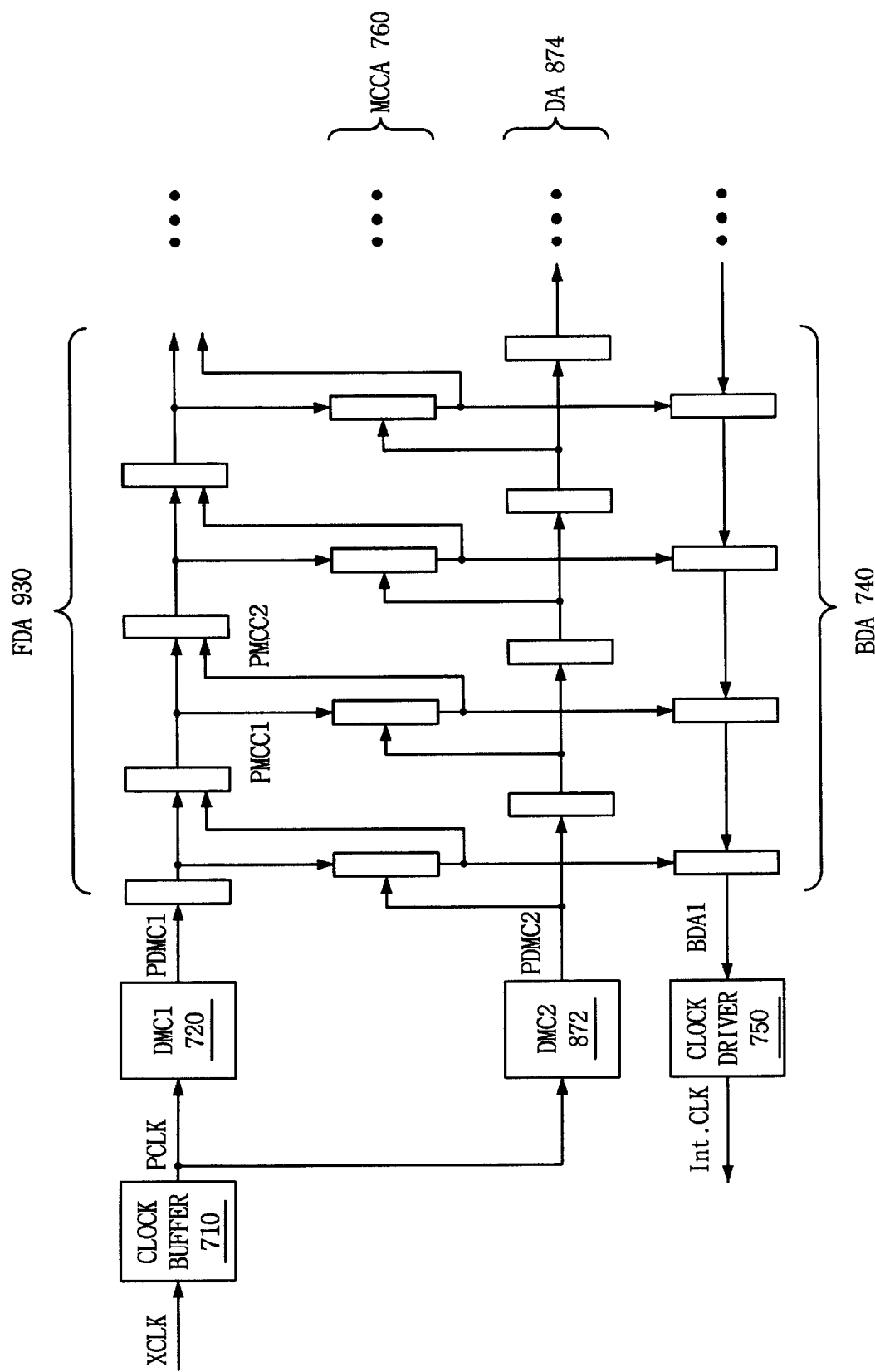
FIG. 9 is a circuit diagram of a circuit made according to a general embodiment of the present invention that is a variation of the embodiment of FIG. 8.

Referring now to FIG. 9, another circuit 900 made according to another general embodiment of the invention is described. Circuit 900 includes many components similar to those of circuit 800, whose description will therefore not be repeated.

Importantly, circuit 900 includes an array FDA 930 that may be made differently than what is shown in FIG. 7 or FIG. 8. Array FDA 930 includes elements that may receive one more input than those of array 730.

In circuit 900, MCC signals PMCC1, PMCC2, . . . are input in units of the forward array FDA 930. This further shapes the signals output from the units of forward array FDA 930, and further shapes the comparison for synchronization purposes at subsequent ones of the MCC units in MCCA 760.

Details and particular embodiments of the above general embodiments are described later in this document.

Figure 10:
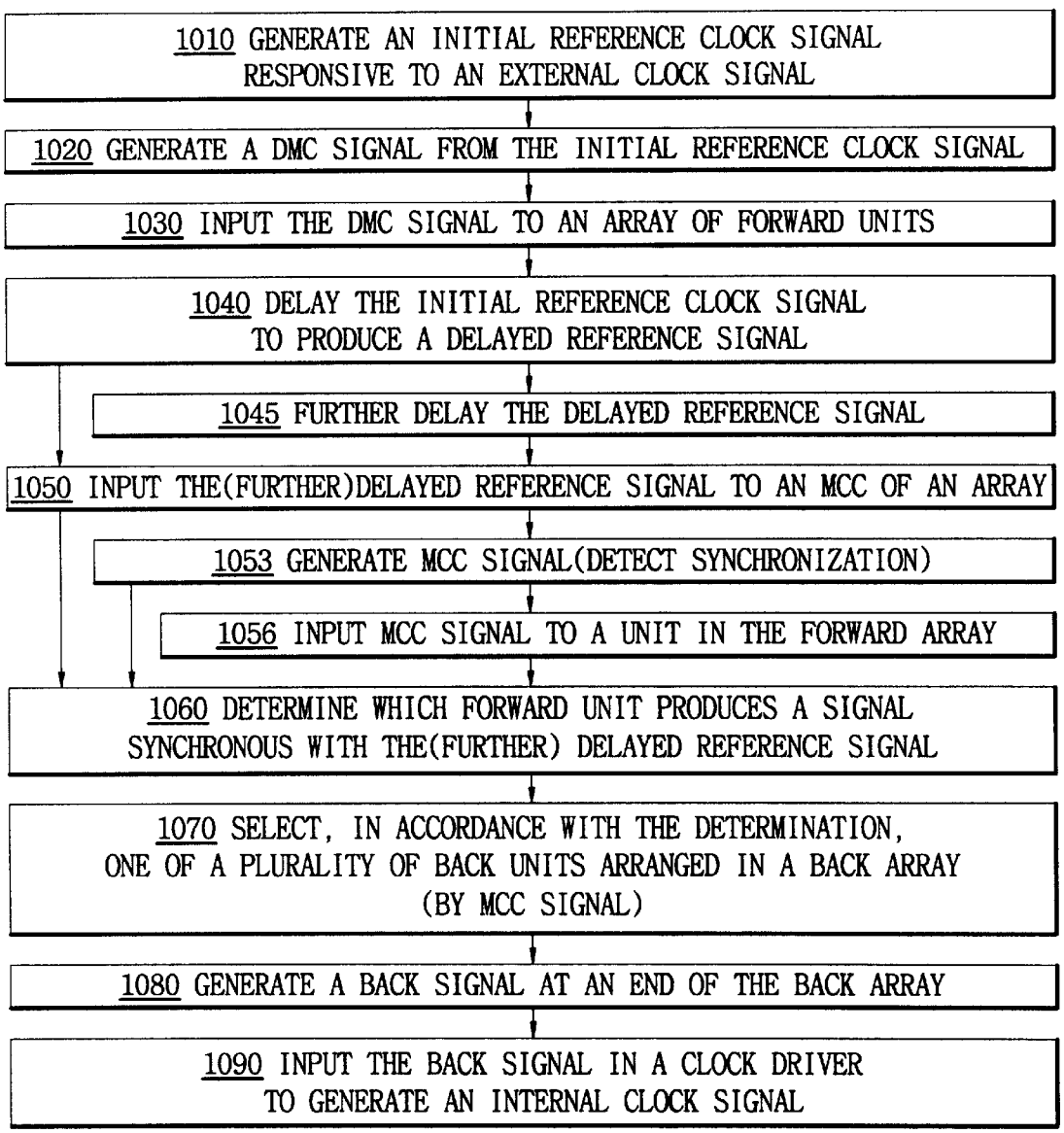
FIG. 10 is a flowchart illustrating a method according to an embodiment of the present invention.

Referring now to FIG. 10, a flowchart 1000 is used to illustrate a method according to an embodiment of the invention. The method of flowchart 1000 may also be practiced by one of the circuits of the invention.

According to a box 1010, an initial reference clock signal PCLK is generated responsive to an external clock signal XCLK.

According to a next box 1020, a DMC signal is generated from the initial reference clock signal PCLK.

According to a next box 1030, the DMC signal is input to an array of forward units.

According to a next box 1040, the initial reference clock signal PCLK is delayed to produce a delayed reference signal PDMC2.

According to an optional next box 1045, the delayed reference signal PDMC2 is further delayed. The result is that different forward units will compare differently delayed versions of it.

According to a next box 1050, the delayed reference signal PDMC2 (whether further delayed or not) is input to an MCC of an MCCA array.

According to a next box 1060, it is determined which of the forward units produces a signal that is synchronous with the delayed reference signal (whether further delayed or not).

According to an optional box 1053 before box 1060, an MCC signal is generated by the MCC. The MCC signal may detect and convey the state of synchronization.

According to one more optional box 1056 before box 1060, the MCC signal is input to a unit in the forward array. This further affects the timing of the signal emerging from that forward unit.

According to a next box 1070, there is selected, in accordance with the determination of synchronization, one of a plurality of back units arranged in a back array. The selection may be made by the MCC signal generated at box 1053.

According to a next box 1080, a back signal BDA1 is generated at an end of the back array. The generation may be initiated by the selected back unit.

According to a next box 1090, the back signal BDA1 is input in a clock driver to generate an internal clock signal Int.CLK.

Having described methods of the invention, a more detailed description now proceeds. It will be appreciated that the following more detailed description applies to both circuits and methods of the invention.

Figure 11:
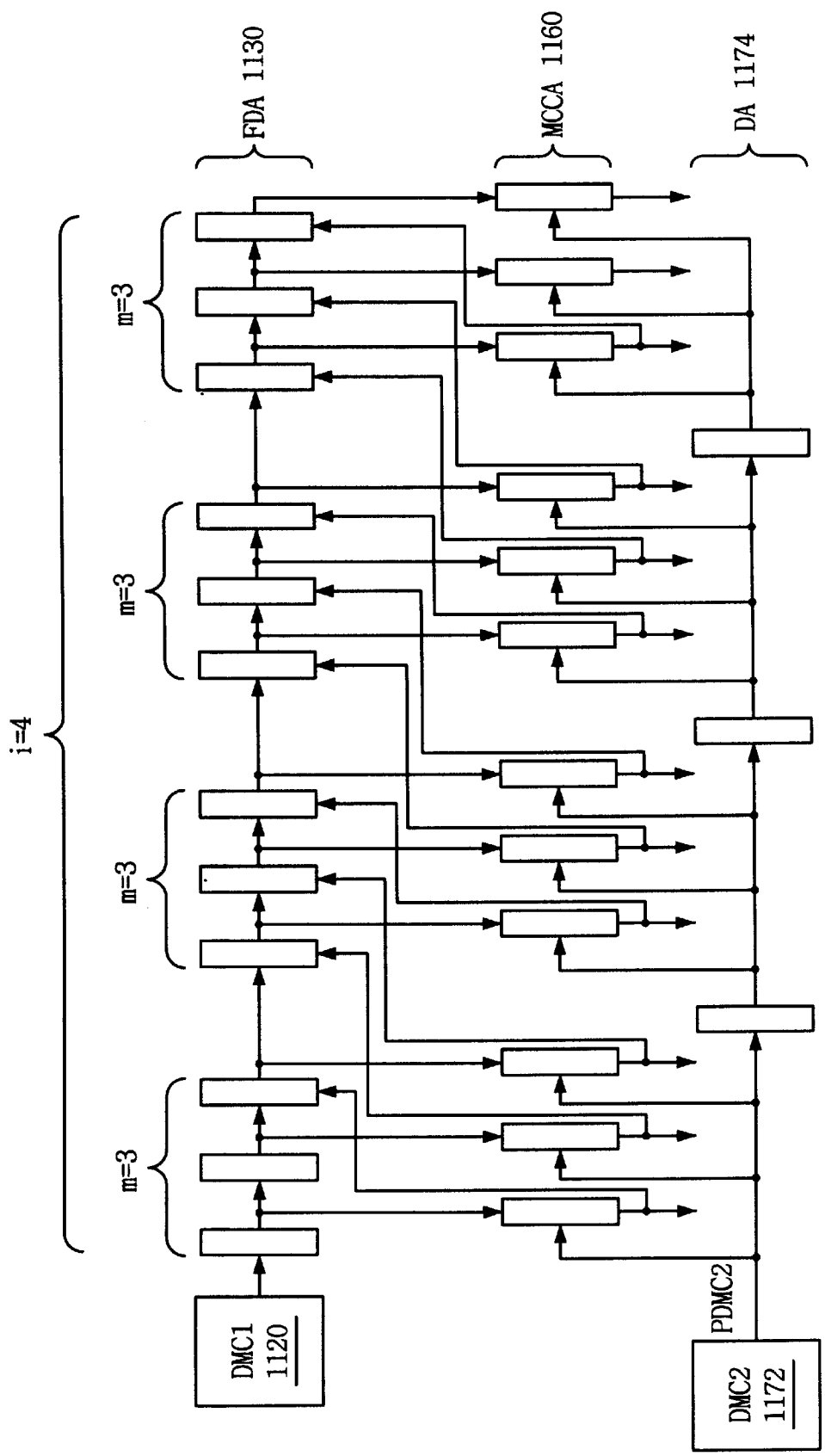
FIG. 11 shows salient details of a preferred embodiment.

Referring now to FIG. 11, even more detailed embodiments are shown. It will be recognized that some components are shown in more detail than in previous drawings, while others are omitted so as not to obscure the drawing unnecessarily. It will also be recognized the values given here are only by way of example. Different numbers may be implemented.

A DMC1 1120 generates a reference signal PDMC1, and outputs it in to a forward array FDA 1130. Forward array FDA 1130 is made from 12 forward units (not numbered individually). These units are shown arranged in i=4 stages of m=3 successive units per stage.

A MCCA array 1160 of MCC units (not numbered individually) is shown, which correspond to the forward units of FDA array 1130. The MCC units provide inputs to corresponding back elements (not shown) of a BDA array. The inputs are MCC signals, which are also provided to some of the forward units.

The delay element includes a delay component made from DMC2 1172. The delay element also includes i−1=4−1=3 additional intermediate delay units (not numbered individually), which are arranged a Delay Array DA 1174. The intermediate delay units correspond individually to at least some of the stages. Each of these units provides a uniformly delayed reference signal to the MCC units in a single one of the stages, but the Delay Array DA 1174 provides a differentially delayed reference signal to the MCC units of different stages.

It is highly preferably that DMC11 120 have a time delay value given by td1+td2, where td1 is the time delay of an initial clock buffer (not shown in FIG. 11), and td2 is the time delay of a clock driver (not shown in FIG. 11). If that is the case, it is highly preferably that DMC2 1172 have a time delay value given by a time delay of the DMC1 divided by m, where m is the number of forward units in each stage.

Two types of embodiments are possible. In the first type, each intermediate delay unit of DA 1174 is coupled to delay by the same amount all the MCCs corresponding to the forward units of the stage that corresponds to the intermediate delay units. For this type, the intermediate delay unit of DA 1174 is coupled at the end of a stage.

In the second type, each intermediate delay unit of DA 1174 is coupled to delay by the same amount only some but not all the MCCs corresponding to the forward units of the stage that corresponds to the intermediate delay units. For this type, the intermediate delay unit of DA 1174 is coupled at the middle of a stage.

One more embodiment of the invention is also described by first referring to FIG. 9. As it will be observed, the MCC signal generating in response to a corresponding forward unit goes into the next forward unit. That is not necessary for practicing the invention, as follows.

Referring again to FIG. 11, it will be observed that some of the MCC signals are generated in response to a signal from a first forward unit, and are input into a second forward unit. But there is an intervening forward unit between the first forward unit and the second forward unit. In other embodiments, there can be more than one such intervening forward unit. Of course, the embodiment of FIG. 11 might be changed so that there are no intervening forward units, such as in FIG. 9.

An optimization of the invention is if the forward units, the back units and the intermediate delay units are made to have identical time delays, although that is not necessary for practicing the invention. The identical delays make the computations simpler. Such units, then, are also called SMD units.

Returning to the above discussion of stages, one reason for including stages is to design the exact phase shift of the internal clock with respect to the external clock. To start with, DMC2 delays the PCLK signal by 1/m, compared to DMC1.

A predetermined number of delay units are added to a reference PCLK path. At every m forward delay units, one delay unit in the delay array Di is additionally inserted in the reference PCLK path, so that a practical SMD locking operation can be performed at a SMD unit delay FDn (=the locked unit) after all the additional delay units (Di) add to reference PCLK path.

The necessary number of units will be better understood from some derivations that follow. In these derivations, the following notation is used.

n: the number of SMD unit delay units (FDi) in the conventional SMD for performing a locking operation;

n': the number of SMD unit delay units (Di) corresponding to additional delays of PCLK in the advanced SMD; and m: the standard number of SMD unit delays for adding one more SMD unit delay to PCLK path of the advanced SMD.

It is assumed, therefore, that a locking operation is performed at the n+n'th delay unit. The locking operation takes place when the following is satisfied:

$$(td1+td2)+n*T(du)+n'*T(du)=tclk+(td1+td2)/m+(n+n')*T(du)/m$$
@advanced SMD locking (Equation 2)

In the above Equation (2), the term (n+n')*T(du)/m may be interpreted as follows. For instance, if n=16 forward delay units (FDi) are utilized for locking a clock, and one SMD unit delay (Di) is inserted at every m=9 forward delay units in the reference PCLK path, delays as much as (16+2)*T(du)/9=2*T(du) may be added to the standard PCLK path, in addition to (td1+td2)/m. To compensate, a time delay of 2*T(du)+(td1+td2)/m should be added to each of the FDA path and the BDA path. As a result, an internal clock is delayed twice much, namely 4*T(du)+2*(td1+td2)/m.

The total phase shift is now determined from Equation 2 as follows:

$$n'*T(du)=(td1+td2)/m+[n*T(du)]/m+[n'*T(du)]/m<=>n'(1-1/m)*T(du)=[td1+td2+n*T(du)]/m<=>n'*T(du)=tclk/(m-1)$$

From the last equation, it is advantageous to set:

$$td3=n'*T(du)=tclk/(m-1) \quad \text{(Equation 3)}$$

It is interesting to note which values can be assumed by td3. For this purpose, the internal clock is expressed in terms of m, starting from Equation 3:

$$\text{Internal clock}=\text{External clock}+td1+(td1+td2)+2*\{tclk-(td1+td2)+td3\}+td2=\text{External clock}+2*tclk+2*td3=\text{External clock}+2*tclk+2/(m-1)*tclk=\text{External clock}+2*tclk[1+1/(m-1)] \quad \text{(Equation 4)}$$

Referring to FIG. 12, Equation 4 yields a table of values of phase shifts that can be attained by the invention, for various values of m. As can be seen, it becomes possible to generate an internal clock having a predetermined phase in relation to an external clock.

Figure 13:
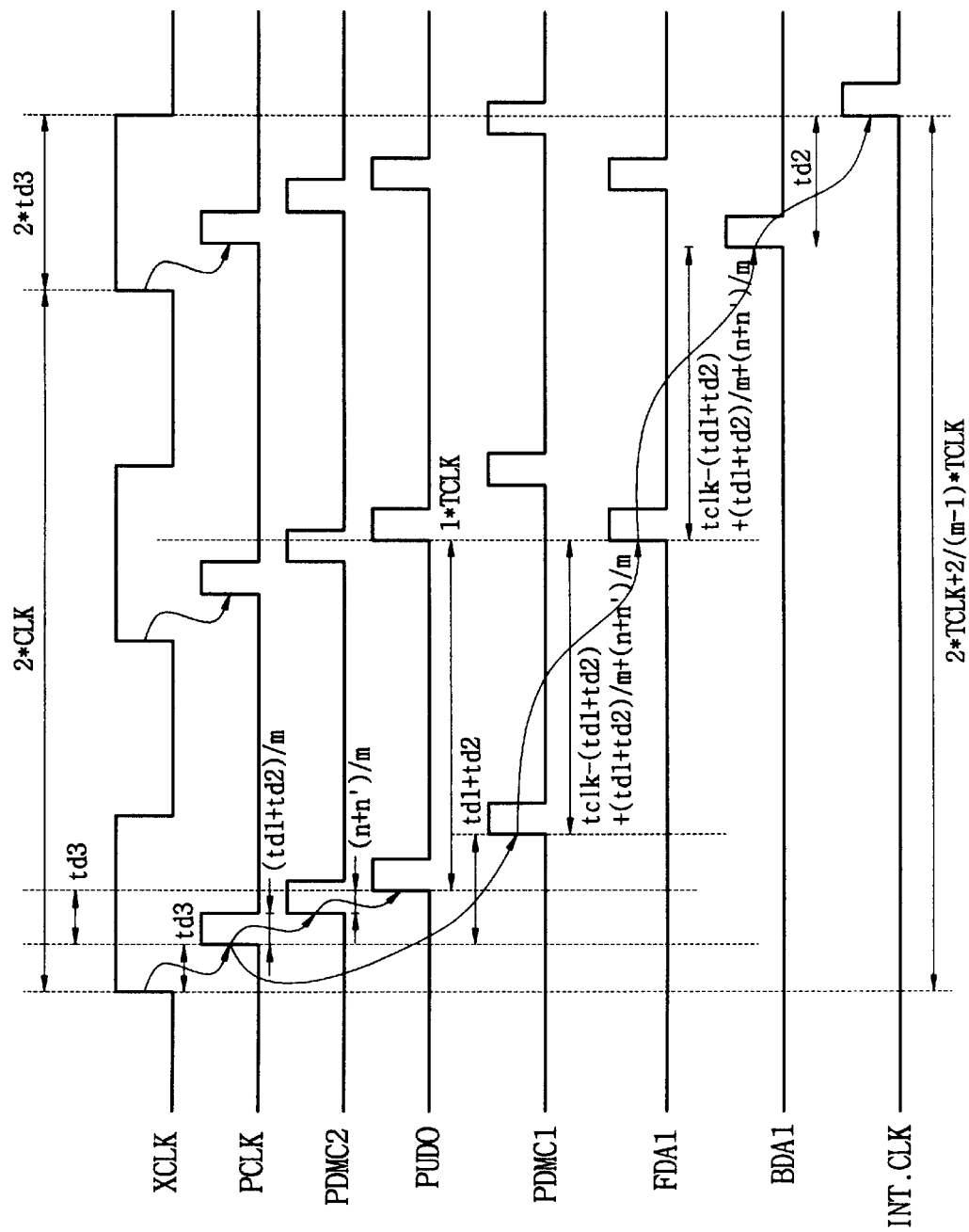
FIG. 13 is a view illustrating relative timing signals for the circuit of FIG. 8.

Referring now to FIG. 13, relative timing views of the major signals are illustrated. Referring also to FIG. 8, signal PCLK is delayed by td1 in relation to the external clock XCLK. Signal PDMC2 is delayed by an additional (td1+td2)/m by DMC2. The PDMC2 is delayed by T(du) from each SMD unit.

Additionally, signal PCLK is delayed by td1+td2 by DMC1, to produce signal PDMC1. Signal PDMC1 is delayed by T(du) from each SMD delay unit in the FDA path, and is compared with the PCLKi in MCCm. PCLKi is a reference clock signal input to MCCm, when locking occurs.

When there is locking, a signal PUDO is output from the forward delay unit at the locking stage. The PUDO signal is delayed by tclk−(td1+td2)+(td1+td2)/m+(n+n')/m in relation to PDMC1. So, the total delay time for the PUDO signal is given by Equation 4 below:

$$PUDO\ \text{delay}=tclk+(td1+td2)+tclk-(td1+td2)+(td1+td2)/m+(n+n')/m \quad \text{(Equation 4)}$$

MCCm compares the PCLKi with PUDO, so that the MCC generates signal PMCCj when locking occurs. The PMCCj passes through n+n' SMD delay units in the BDA path, and exits as signal BDA1.

Clock driver delays the BDA1 by td2 and generates internal clock Int.CLK. As a result, the internal clock has delay as much as 2*tclk+2*tclk/(m−1) in relation to external clock.

The forward units, the back units and the intermediate delay units are made to have identical time delays by implementing them with identical structures. Design economies are achieved this way.

Figure 14:
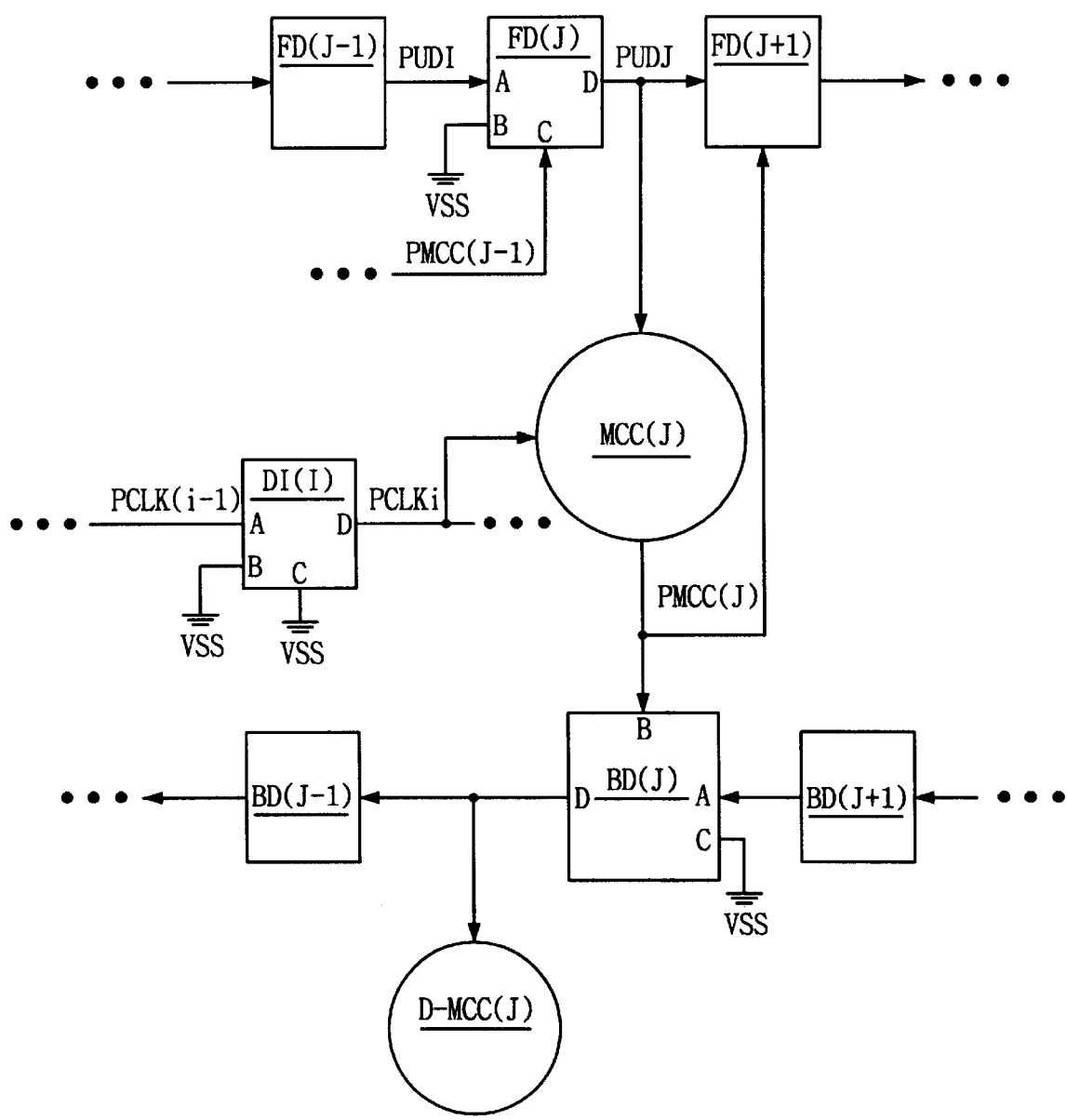
FIG. 14 is a view of certain elements of the circuit of FIG. 9.

Referring now to FIG. 14, certain elements of the circuit of FIG. 9 are studied in more detail, for the purpose of implementing identical structures. These include forward array units FD(J−1), FD(J), FD(J+1), intermediate delay unit DI(I), MCC unit MCC(J), and back array units BD(J+1), BD(J), BD(J−1). MCC unit MCC(J) outputs a signal PMCC(J) that is input in a subsequent forward unit, which may or may not be unit FD(J+1).

All units within a single array may advantageously be identical. In addition, all units of the forward, intermediate and back arrays are preferably made identical. It should be noted that forward array unit FD(J), intermediate delay unit DI and back array unit BD(J) have four terminals labeled A, B, C, D.

Figure 15:
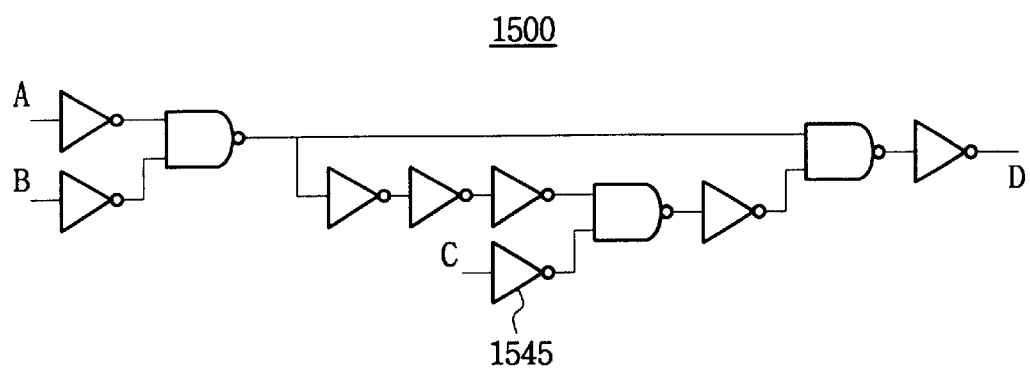
FIG. 15 is a schematic diagram of a preferred circuit for components of FIG. 14.
Figure 16:
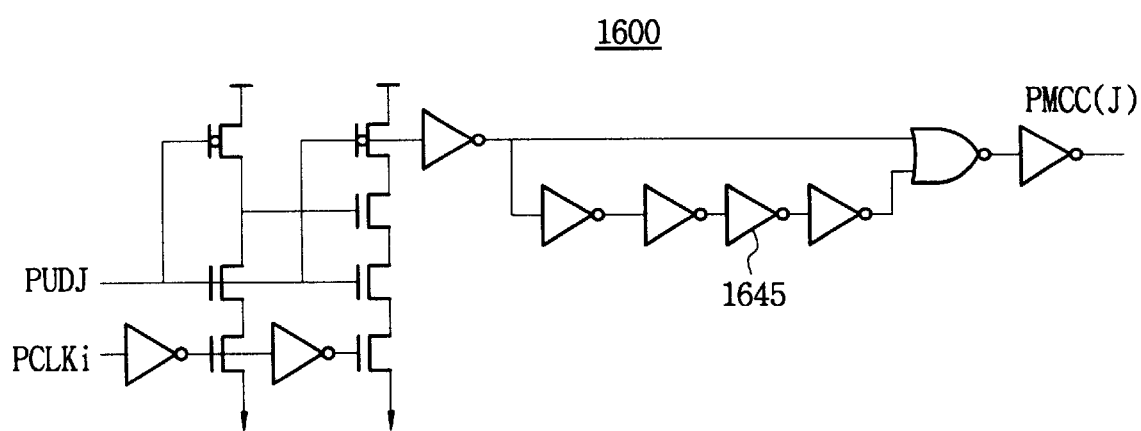
FIG. 16 is a schematic diagram of a preferred circuit for a component of FIG. 14.

Circuits are now described with reference to FIG. 15 and FIG. 16, for implementing the units of FIG. 14. It should be kept in mind that the circuits of FIG. 15 and FIG. 16 are for the case where signal PMCC(J) goes into unit FD(J+1). If not, modifications may be warranted, as also described below.

Referring now to FIG. 15, a preferred circuit 1500 is shown for implementing forward array unit FD(J), intermediate delay unit DI and back array unit BD(J). The circuit may be made from a short pulse generator having three input nodes A, B, C and an output node D. It is particularly implemented with inverters and NAND gates.

Forward unit FD(J) receives signal PUDI at node A from the previous forward unit FD(J−1) in the forward array, and outputs a signal PUDJ from node D for the next forward unit FD(J+1) in the forward array. Node B is grounded. Node C receives a signal PMCC(J−1) of another MCC (not shown), which may or may not be the MCC immediately before MCC(J). Forward unit FD(J) is disabled by the signal PMCC(J−1) when locking occurs. When the PUDI transit low to high, PUDJ is generated, with predetermined high pulse width and has a delay of T(du) compared to PUDI.

Intermediate unit DI(I) is connected as a delay. Input C and one of inputs A, B are grounded. Each unit in the delay array DI receives a delayed clock signal PCLK(i−1), and generates a further delayed clock signal PCLKi.

Back unit BD(J) receives a signal at node A from the previous back unit BD(J+1) in the back array, and outputs a signal from node D for the next back unit BD(J−1) in the back array. Node C is grounded, while node B receives signal PMCC(J).

Operation of the circuit for locking is based on the idea that resolution between neighboring unit delays becomes progressively smaller, until it becomes smaller than delay T(du).

In the case that, in FIG. 14, signal PMCC(J) goes into unit FD(J+2) (not shown), a modification is warranted, because inverted signals should be considered. The modification might be deleting inverter 1545 from circuit 1500.

Referring now to FIG. 16, a circuit 1600 is shown for implementing MCC unit MCC(J) of FIG. 14. Circuit 1600 is intended to sense a moment when two input signals PUDJ, PCLKi transit from low to high. Circuit 1600 is thus constructed as a latch type of dynamic gate. It is particularly implemented with transistors, inverters, and a NOR gate.

In circuit 1600, when there is a big difference in the phase of the two input signals, that is, when a phase of signal PCLKi is faster than that of PUDJ, a plurality of serially connected NMOS units react quickly, because one of which has already been turned on, so that output signal PMCC is generated fast. When there is only a slight difference in the phase of the two input signals, the serially connected NMOS units react slowly, so that output signal PMCC is generated slowly.

In the case that, in FIG. 14, signal PMCC(J) goes into unit FD(J+2) (not shown), a modification is warranted, because inverted signals should be considered. The modification might be deleting inverter 1645 from circuit 1600.

As described above, there are advantages in the multiphase clock generator with an advanced SMD of the present invention having 2 cycle locking time, in that it can generate an internal clock having a variety of phases, make an adequate sample of input data signals by delaying to generate an internal clock signal even if an external clock signal and data signals are input to a semiconductor memory device with a predetermined phase difference, rather than the general phase difference of 90 degrees, and intentionally control the time to output data by delaying to generate an internal clock.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred form, the specific embodiments as disclosed and illustrated herein are not to be considered in a limiting sense. Indeed, it should be readily apparent to those skilled in the art in view of the present description that the invention may be modified in numerous ways. The inventor regards the subject matter of the invention to include all combinations and subcombinations of the various elements, features, functions and/or properties disclosed herein.

The following claims define certain combinations and subcombinations, which are regarded as novel and non-obvious. Additional claims for other combinations and subcombinations of features, functions, elements and/or properties may be presented in this or a related document.

The invention claimed is:

1. A circuit comprising:
   a clock buffer to generate an initial reference clock signal responsive to an external clock signal;
   a delay monitoring circuit (DMC) to receive the initial reference clock signal;
   an array of forward units arranged in a plurality of stages to receive a signal from the DMC;
   an array of back units;
   a clock driver to produce an internal clock signal in response to a back signal received from one of the back units;
   a standalone delay element to produce a delayed reference signal responsive to the initial reference clock signal, wherein the standalone delay element includes a plurality of intermediate delay units corresponding individually to at least some of the stages of the forward units; and
   a plurality of mirror control circuits (MCCs), each MCC receiving an output of one of the forward units and the delayed reference clock signal,
   wherein when one of the outputs of the forward units is synchronized with the delayed reference clock signal, one of the back units is thereby activated to initiate generation of the back signal.

2. The circuit of claim 1, in which
   the forward units are arranged in stages of m units per stage, and
   the standalone delay element includes a delay component having a time delay value given by a time delay of the DMC divided by m.

3. The circuit of claim 1, in which
   at least one of the MCCs is made as a latch to detect synchronization by locking only when a transition from the output of the delayed reference clock signal occurs not later than a transition from the output of the forward unit.

4. The circuit of claim 1, in which the standalone delay element is comprised of logic elements.

5. The circuit of claim 1, in which
   each of the intermediate delay units produces differently delayed versions of the delayed reference signal, and
   one of the intermediate delay units is coupled to provide a single version of the delayed reference signal to all the MCCs corresponding to the forward units of a single one of the stages.

6. The circuit of claim 1, in which
   each of the intermediate delay units produces differently delayed versions of the delayed reference signal, and
   one of the intermediate delay units is coupled to provide a single version of the delayed reference signal to some but not all the MCCs corresponding to the forward units of a single one of the stages.

7. The circuit of claim 1, in which
   one of the intermediate delay units is coupled to delay by the half amount all the MCCs corresponding to the forward units of the stage corresponding to the intermediate delay units.

8. The circuit of claim 1, in which
   each one of the stages includes m units, and
   the delay element includes a delay component having a time delay value given by a time delay of the DMC divided by m.

9. The circuit of claim 1, in which
   the forward units, the back units and the intermediate delay units are made such that they have identical time delays.

10. The circuit of claim 1, in which
    at least one of the MCCs is made as a latch to detect synchronization by locking only when a transition from the output of the delayed reference clock signal occurs not later than a transition from the output of the forward unit.

11. The circuit of claim 1, in which
    each MCC generates a MCC signal to communicate a detected state of synchronization to a corresponding one of the back units, and
    at least one of the MCC signals is input in one of the units of the forward array.

12. The circuit of claim 1, in which
    each MCC generates a MCC signal to communicate a detected state of synchronization to a corresponding one of the back units, and
    at least one of the MCC signals is input in one of the units of the forward array.

13. The circuit of claim 12, in which
    the forward units, the back units and the intermediate delay units are made such that they have identical time delays.

14. The circuit of claim 12, in which
    the forward units, the back units and the intermediate delay units have identical structures.

15. The circuit of claim 12, in which
    at least one of the MCCs is made as a latch to detect synchronization by locking only when a transition from the output of the delayed reference clock signal occurs not later than a transition from the output of the forward unit.

16. The circuit of claim 12, in which
    the MCC signal is generated in response to a signal from a first forward unit and is input to a second forward unit, and
    there is an intervening forward unit between the first forward unit and the second forward unit.

17. The circuit of claim 16, in which there are more than one intervening forward units between the first forward unit and the second forward unit.

18. A method comprising:

generating an initial reference clock signal responsive to an external clock signal;

generating a delay monitoring circuit (DMC) signal from the initial reference clock signal;

inputting the DMC signal to an array of forward units arranged in stages;

delaying the initial reference clock signal to produce a delayed reference signal using a plurality of intermediate delay units corresponding individually to at least some of the stages of the forward units;

inputting the delayed reference signal to an array of mirror control circuits (MCCs);

determining which forward unit produces a signal synchronous with the delayed reference signal;

selecting, in accordance with the determination, a corresponding one of a plurality of back units arranged in a back array;

generating a back signal at an end of the back array in accordance with the selected back unit; and inputting the back signal in a clock driver to generate an internal clock signal.

19. The method of claim 18, in which one of the MCCs receives an output of one of the forward units and the delayed reference clock signal, and latches only when a transition from the output of the delayed reference clock signal occurs not later than a transition from the output of the forward unit.

20. The method of claim 18, further comprising:

generating a MCC signal to communicate a detected state of synchronization to a corresponding one of the back units; and inputting the MCC signal to one of the units of the forward array.

21. The method of claim 18, further comprising:

further delaying the delayed reference signal, such that different forward units compare differently delayed versions of it.

22. The method of claim 18, in which the forward units, the back units and the intermediate delay units delay signals by identical amounts of time.

* * * * *